United States Patent [19]

Suzuki et al.

[11] Patent Number: 4,970,455
[45] Date of Patent: Nov. 13, 1990

[54] DEVICE FOR MEASURING ELECTROMAGNETIC WAVE LEAKAGE

[76] Inventors: Hirosuke Suzuki, 21-8, Kotesashi-machi, Tokorozawa-shi, Saitama; Hidenori Furuta, 2-203 Bellpia Motokaji, 428-3 Maruyama Ohaza-Noda, Iruma-shi, Saitama, both of Japan; Kenneth R. Davis, Rte. 1, Box 919D, Flagstaff, Ariz. 86004

[21] Appl. No.: 408,631

[22] Filed: Sep. 18, 1989

[30] Foreign Application Priority Data

Nov. 2, 1988 [JP] Japan .................................. 63-279553

[51] Int. Cl.$^5$ ...................... G01R 21/01; G01R 27/00
[52] U.S. Cl. ........................................ 324/95; 324/627
[58] Field of Search .......................... 324/95, 627, 628; 343/781 P, 781 CA

[56] References Cited

U.S. PATENT DOCUMENTS 3,276,022  9/1966  Brunner ........................ 343/781 CA Primary Examiner—Ernest F. Karlsen

[57] ABSTRACT

A device for measuring electromagnetic wave leakage from power supply lines and digital equipment by a system of focused concave reflective plates, an antenna to disburse and detect radiation, and an instrument to measure the leaked radiation.

2 Claims, 1 Drawing Sheet

DEVICE FOR MEASURING ELECTROMAGNETIC WAVE LEAKAGE

FIELD OF THE INVENTION

The present invention relates to devices for measuring electromagnetic wave leakage from transmission lines, digital instruments, and the like.

BACKGROUND OF THE INVENTION

With the progress of our present-day electronic society, electromagnetic noise pollution is becoming a new source of industrial pollution. Such electromagnetic noise can be divided into two types. One type consists of conduction from power supply lines connected directly to digital equipment, and the like, while the other type consists of the radiation of spontaneously generated electromagnetic wave leakage from digital equipment and the like. In both cases, such electromagnetic noise has a deleterious effect on other digital equipment, and may lead to the malfunctioning of such equipment. In cases where preventive measures are required, noise can be prevented relatively simply by means of various types of noise filters. In the case of radiated noise, various preventive measures have been used, both in digital equipment which generates electromagnetic wave leakage and digital equipment which is affected by such leakage, but in many cases the prevention of such noise is rather difficult. In order to prevent such radiation noise, it is first necessary to accurately measure the electromagnetic wave leakage from the digital equipment involved.

Conventionally, electromagnetic wave leakage from digital equipment has been measured by various methods. In one method the digital equipment being measured is placed inside a large shielded room along with a measuring instrument such as an antenna, and a measurer, after which power is supplied to the digital equipment being measured and the intensity of the radiation field created by the actually occuring electromagnetic wave leakage is measured (as in the measurement method described in CISPR Standards-Publ. 22. In another a portion of a high-frequency transmission line used for connection to the digital equipment in question is placed inside a brass tube of a fixed shape, which acts as an antenna, and the power value of the electromagnetic wave leakage occuring during signal transmission is measured (as in the measurement method for measuring electromagnetic wave leakage using high-frequency transmission lines described in MIL Standard MIL-T-81490). Other methods used include the absorption clamp method described in CISPR Standards-Publ. 16, the surface transfer impedance method described in MIL Standard MIL-C-85485, the electric field method described in NASDA Standard NASDA-QTS-1012, and the cross talk measurement method described in VDE Standard VG95373 Part 15. In such cases, the nature and frequency band of the signal involved are ascertained and the measurement method used is selected so that it will be the most suitable method for the packaging conditions involved.

However, in the case of the measurement method described in CISPR Standards-Publ. 22, measurements cannot be performed without the provision of an expensive shielded room which occupies a large area. Furthermore, the measurement method described in MIL Standard MIL-T-81490 is a measuring method for high-frequency transmission lines and cannot be used to perform measurements in the case of general digital equipment. Further, this method is incapable of frequency sweeping. In the case of the remaining measurement methods described in public standards, the effects of quasi-electrostatic fields and induction fields cannot be eliminated. Accordingly, electromagnetic wave leakage is compared relatively to the power value of electromagnetic wave leakage from other electromagnetic equipment used as a standard. Since an absolute power value cannot be obtained, comparison is difficult. Then, there is no single measurement method which always satisfies all requirements.

SUMMARY OF THE INVENTION

The present invention provides a device for measuring electromagnetic wave leakage which does not require the use of shielded room, which is capable of broad frequency sweeping, and which is able to eliminate the effects of quasi-electrostatic fields and induction fields so that an absolute power value can be obtained.

The present invention comprises a device for measuring electromagnetic wave leakage including a primary reflecting plate having a concave surface which faces and accomodates the object being measured, a secondary reflecting plate having a concave surface which faces the concave surface of the primary reflecting plate and which has a focus located in the vicinity of the position of said primary reflecting plate, a tertiary reflecting plate having a concave surface which faces the concave surface of the secondary reflecting plate and which has a predetermined focus, a quaternary reflecting plate having a concave surface which faces the concave surface of the tertiary reflecting plate and which is located in the vicinity of the focus of the tertiary reflecting plate, an antenna installed facing the concave surface of the quaternary reflecting plate, and a measuring instrument which measures the electromagnetic waves that reach the object of measurement when high-frequency electromagnetic waves are fed into the antenna and radiated from the antenna. The object of measurement is first placed on the concave surface of the primary reflecting plate. Next, a sweep oscillator, for example, is connected to the antenna which is located (as a standard device) on the concave surface of the quaternary reflecting plate. The electromagnetic waves leaking from this antenna are successively reflected by the quaternary reflecting plate, and are thus ultimately collected at the object of measurement. Accordingly, the total absolute power value of electromagnetic wave leakage can be obtained by determining the power value of the electromagnetic waves by use of a measuring instrument such as a network analyzer, which is connected to the object of measurement. Further, if necessary, frequency sweeping and recording by means such as an X-Y recorder can also be performed.

As to the shapes of the primary reflecting plate, secondary reflecting plate, tertiary reflecting plate, and quaternary reflecting plate, concave surfaces having the form of interior spherical surfaces obtained by splitting a hollow sphere in half may be used. Alternatively, concave surfaces consisting of parabolic interior surfaces obtained by the rotation of a parabola about its central axis may also be used. In order to measure long electrical products, concave interior surfaces formed by splitting a pipe in half along its direction of length may be used or parabolic concave surfaces formed by bending flat plates so that their interior surfaces (i.e. the interior surfaces formed by bending) follow a constant parabolic curve when viewed in cross section may be used. It is desirable to use concave surfaces which have a focus and a concave surface having the focus described above is used for at least the secondary reflecting plate. The reflecting plates need not all be of the same size or shape; if necessary reflecting plates of different sizes and shapes may be combined. Further, the foci of the respective reflecting plates need not all be lined up on a single straight line. As long as an appropriate relationship is maintained between reflecting plates which face each other, and as long as each reflecting plate can receive leaking electromagnetic waves and send all or a fixed proportion of said waves to the next reflecting plate, the reflecting plates may be installed at respective angles to each other.

DESCRIPTION OF THE EMBODIMENTS OF THE INVENTION

Figure 1:
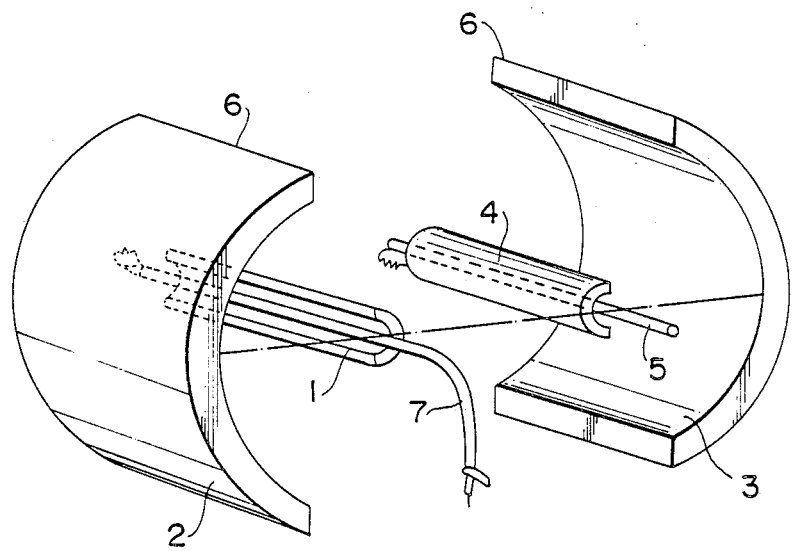
FIG. 1 is an oblique view of a device for measuring electromagnetic wave leakage which illustrates one practical example of the present invention.

The invention can best be described with reference to the figures. With reference to FIG. 1, a device 6 for measuring electromagnetic wave leakage is constructed which is equipped with a primary reflecting plate 1, which has a concave surface, a secondary reflecting plate 2 having a concave surface which faces the concave surface of primary reflecting plate 1, and which has a focus located in the vicinity of the position of primary reflecting plate 1, a tertiary reflecting plate 3 with a concave surface which faces the concave surface of secondary reflecting plate 2, and which has a predetermined focus, a quaternary reflecting plate 4 having a concave surface which faces the concave surface of tertiary reflecting plate 3, and which is located in the vicinity of the focus of tertiary reflecting plate and an antenna 5 which is installed facing the concave surface of quaternary reflecting plate 4. This device 6 is characterized by the fact that the concave surface of primary reflecting plate 1 and the concave surface of quaternary reflecting plate 4 are oriented so that they do not face each other.

Device 6 for measuring electromagnetic wave leakage is primarily suitable for the measurement of electromagnetic wave leakage from digital equipment which is linear in form. The various parts of device 6 for measuring electromagnetic wave leakage are supported by supporting columns or beams, which are not shown in the figures.

Examples of concrete dimensions, shapes and materials are indicated for device 6 for measuring electromagnetic wave leakage. Primary reflecting plate 1 and quaternary reflecting plate 4 are obtained by cutting a brass tube with a length of 1000 mm and an internal diameter of 27 mm in half along its length. A silver-plated soft copper wire having an external diameter of 0.912 mm and covered by a porous tetrafluorinated resin dielectric are installed on the interior surface of quaternary reflecting plate 4 to form a transmission line having a characteristic impedance of 150 ohms. This is used as the antenna 5. Further, a 150 ohm resistor is connected to the end of antenna 5. Secondary reflecting plate 2 and tertiary reflecting plate 3 consist of metal plates having parabolic concave surfaces of width 1300 mm, height 1000 mm, and focal length 300 mm.

As is indicated by the one-dot chain line in FIG. 1, these parts are installed so that the centerlines of primary reflecting plate 1, secondary reflecting plate 2, tertiary reflecting plate 3, quaternary reflecting plate 4, and antenna 5 are located parallel to each other on the same plane. The distance from the centerline of primary reflecting plate 1 to the centerline of secondary reflecting plate 2, the distance from the centerline of the secondary reflecting plate 4 to the centerline of quaternary reflecting plate 3, and the distance from the centerline of quaternary reflecting plate 4 to the centerline of tertiary reflecting plate 3 are all set at 600 mm.

Using device 6 for measuring electromagnetic wave leakage, the electromagnetic wave leakage of high-frequency transmission line 7 shown is FIG. 1 is measured as follows. High-frequency transmission line 7 constituting the object of measurement, is first fastened to the concave surface of primary reflecting plate 1 such as by means of adhesive tape. Next, a measuring instrument, such as a network analyzer (not shown in the figures), is connected to high-frequency transmission line 7. Next, a signal is caused to flow through antenna 5 by means of a sweep oscillator, for instance (not shown in the figures). The electromagnetic waves leaking from antenna 5 are successively reflected by quaternary reflecting plate 4, tertiary reflecting plate 3, secondary reflecting plate 2, and primary reflecting plate 1, and are ultimately collected in high-frequency transmission line 7 which constitutes the object of measurement. Accordingly, the total absolute power value of the electromagnetic wave leakage of high-frequency transmission line 7 can be determined by using the measuring instrument connected to high-frequency transmission line 7 to measure the power value of the electromagnetic waves. If necessary, frequency sweeping can also be performed and recording can be performed by means of an X-Y recorder, for example (not shown in the figures).

In cases where it is necessary to calibrate device 6 for measuring electromagnetic wave leakage or to calibrate various other measuring instruments prior to making, such as the above, measurements, an antenna which is similar in structure to antenna 5 installed on quaternary reflecting plate 4 may also be installed on primary reflecting plate 1 and used as a standard antenna.

The reflecting plates need not all be of the same size or shape. If necessary, reflecting plates of different sizes and shapes may be combined. In addition, the foci of the respective reflecting plates need not all be lined up on a single straight line. As long as an appropriate relationship is maintained between reflecting plates which face each other and as long as each reflecting plate can receive leaking electromagnetic waves and send all or a fixed proportion of said waves to the next reflecting plate, the reflecting plates may be installed at respective angles to each other.

Figure 2:
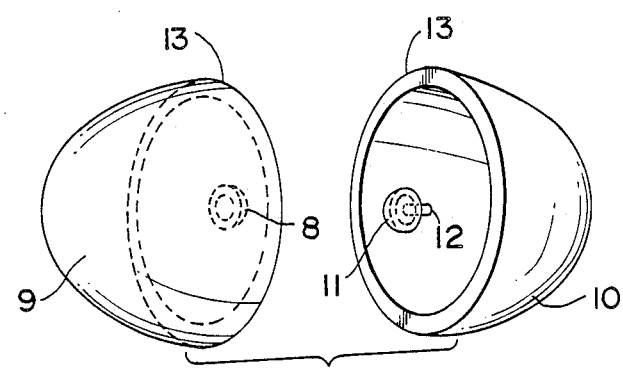
FIG. 2 is an oblique view of a different device for measuring electromagnetic wave leakage which illustrates another practical example of the present invention.

When measurements for the above standard antenna were made utilizing a 50-ohm coaxial cable equipped with a single-ply braided shield having a shielding density of 95%, a semi-rigid cable, network analyzer, and a device 6 for measuring electromagnetic wave leakage which had the aforementioned dimensions and structure noted above, it was found that measurements could be performed continuously without resonance between 8 GHz and 18 GHz, and that the measurement results obtained showed good reproducibility. Further, the noise level was maintained at minus 120 dB. which indicated that measurements could be performed without using a shielded room. In addition, when these measurements results were compared with measurements of electromagnetic wave leakage obtained according to MIL Standard MIL-T-81490, a good correlation was found between the two sets of results. Furthermore, when these measurement results were subjected to a theoretical comparative investigation, it was confirmed that the effects of quasi-electrostatic fields and induction fields were excluded, so that only ideal electromagnetic wave leakage was measured. reference to FIG. 2, a device 13 for measuring electromagnetic wave leakage is constructed which is equipped with a primary reflecting plate 8 having a concave surface, a secondary reflecting plate 9 having a concave surface which faces the concave surface of primary reflecting plate 8, and having a focus located in the vicinity of the position of primary reflecting plate 8, a tertiary reflecting plate 10 having a concave surface which faces the concave surface of secondary reflecting plate 9 and which has a predetermined focus, a quaternary reflecting plate 11 having a concave surface which faces the concave surface of tertiary reflecting plate 10 and which is located in the vicinity of the focus of tertiary reflecting plate 10, and an antenna 12 which is installed on the concave surface of quaternary reflecting plate 11. Device 13 is characterized by the fact that the concave surface of primary reflecting plate 8 and the concave surface of quaternary reflecting plate 11 are oriented so that they do not face each other.

As to the shapes of primary reflecting plate 8, secondary reflecting plate 9, tertiary reflecting plate 10, and quaternary reflecting plate 11, concave surfaces having the form of interior spherical surfaces obtained by splitting a hollow sphere in half may be used. Alternatively, concave surfaces consisting of parabolic interior surfaces obtained by the rotation of a parabola about its central axis may also be used. Further, it is desirable to use concave surfaces which have a focus, and a concave surface having the focus described above is used for at least the secondary reflecting plate. Moreover, the reflecting plates need not all be of the same size or shape. If necessary, reflecting plates of different sizes and shapes may be combined. Also, the centers of the respective plates need not all be lined up on a single straight line. As long as an appropriate relationship is maintained between reflecting plates which face each other and as long as each reflecting plate can receive leaking electromagnetic waves and send all or a fixed proportion of said waves to the next reflecting plate, the reflecting plates may be installed at respective angles to each other.

Device 13 for measuring electromagnetic wave leakage is primarily suitable for the measurement of electromagnetic wave leakage from digital equipment which can be viewed practically as having the form of a point. The various parts of device 13 for measuring electromagnetic wave leakage are supported by supporting columns or beams which are not shown in the figures. Device 13 for measuring electromagnetic wave leakage is used as follows. The digital equipment constituting the object of measurement (not shown in the figures) is first placed on the concave surface of primary reflecting plate 8. Next, a sweep oscillator (not shown in the figures) is connected to antenna 12 located on the concave surface of quaternary reflecting plate 11 The electromagnetic waves radiated from this antenna 12 are successively reflected by quaternary reflecting plate 11, tertiary reflecting plate 10 secondary reflecting plate 9, and primary reflecting plate 8, and are ultimately collected in the object of measurement. Accordingly, the total absolute power value of the electromagnetic wave leakage of the object of measurement (not shown in the figures) can be determined by measuring the power value of the electromagnetic waves using a measuring instrument, such as a network analyzer, which is connected to said object of measurement. If necessary, frequency sweeping can be performed and recording can be performed by means such as an X-Y recorder (not shown in the figures).

The present invention possesses the following special merits: no shielded room is required and frequency sweeping across a broad range is possible. Further, the effects of quasi-electrostatic fields and induction fields can be excluded. As a result, the electromagnetic wave leakage is not compared relatively to the power value of electromagnetic wave leakage from other electromagnetic equipment used as a standard. Instead, an absolute power value is obtained.

The present invention is not limited to the above practical examples of application. Various modifications are possible within the technical spirit of the present invention, such as the dimensions, structures, and materials of the respective reflecting plates and antenna, platings or coatings may be formed, and walls or a box may be installed around the device for measuring electromagnetic wave leakage.

We claim:

1. A device for measuring electromagnetic wave leakage comprising:
   (a) a primary reflecting plate having a concave surface which faces and accomodates the object being measured;
   (b) a secondary reflecting plate having a concave surface which faces the concave surface of said primary reflecting plate and having a focus located in the vicinity of the position of the said primary reflecting plate;
   (c) a tertiary reflecting plate having a concave surface which faces the concave surface of said secondary reflecting plate and which has a predetermined focus;
   (d) a quaternary reflecting plate having a concave surface which faces the concave surface of said tertiary reflecting plate and which is located in the vicinity of the focus of said tertiary reflecting plate;
   (e) an antenna which is located facing the concave surface of said quaternary reflecting plate; and
   (f) a measuring instrument for measuring electromagnetic waves that reach the object of measurement when high-frequency electromagnetic waves are fed into said antenna and radiated from said antenna.

2. A device of claim 1 wherein parts (a) through (f) are positioned and adjusted so as to operate at an electromagnetic noise level of at least below minus 120 dB.

* * * * *